United States Patent
Cho

(10) Patent No.: US 9,343,497 B2
(45) Date of Patent: May 17, 2016

(54) IMAGERS WITH STACKED INTEGRATED CIRCUIT DIES

(71) Applicant: Semiconductor Components Industries, LLC, Phoenix, AZ (US)

(72) Inventor: Taehee Cho, Palo Alto, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 220 days.

(21) Appl. No.: 14/026,731

(22) Filed: Sep. 13, 2013

(65) Prior Publication Data

US 2014/0077063 A1 Mar. 20, 2014

Related U.S. Application Data

(60) Provisional application No. 61/703,617, filed on Sep. 20, 2012.

(51) Int. Cl.
*H01L 27/146* (2006.01)

(52) U.S. Cl.
CPC .... *H01L 27/14634* (2013.01); *H01L 27/14618* (2013.01); *H01L 2924/0002* (2013.01)

(58) Field of Classification Search
CPC ............... H01L 27/14618; H01L 27/14634; H01L 2924/00; H01L 2924/0002
See application file for complete search history.

(56) References Cited

U.S. PATENT DOCUMENTS

| | | | |
|---|---|---|---|
| 6,518,909 B1 * | 2/2003 | Yang et al. | 341/155 |
| 6,778,212 B1 * | 8/2004 | Deng et al. | 348/222.1 |
| 6,809,769 B1 * | 10/2004 | Yang | 348/308 |
| 6,831,684 B1 * | 12/2004 | Ewedemi et al. | 348/222.1 |
| 6,847,399 B1 * | 1/2005 | Ang | 348/308 |
| 6,917,090 B2 * | 7/2005 | Moden | 257/431 |
| 6,975,355 B1 * | 12/2005 | Yang et al. | 348/308 |
| 6,985,169 B1 * | 1/2006 | Deng et al. | 348/61 |
| 6,985,181 B2 * | 1/2006 | Ewedemi et al. | 348/294 |
| 6,989,589 B2 * | 1/2006 | Hammadou et al. | 257/685 |
| 7,361,989 B1 * | 4/2008 | Adkisson et al. | 257/737 |
| 7,663,231 B2 | 2/2010 | Chang et al. | |
| 8,144,227 B2 * | 3/2012 | Kobayashi | 348/308 |
| 8,432,032 B2 | 4/2013 | Lin et al. | |
| 8,946,610 B2 * | 2/2015 | Iwabuchi et al. | 250/208.1 |
| 2004/0095495 A1 * | 5/2004 | Inokuma et al. | 348/308 |
| 2005/0280728 A1 * | 12/2005 | Ishikawa et al. | 348/294 |

(Continued)

FOREIGN PATENT DOCUMENTS

WO    WO 2011/083722 A1 *  7/2011

OTHER PUBLICATIONS

Jenkin, U.S. Appl. No. 13/886,528, filed May 3, 2013.

*Primary Examiner* — John Lee
(74) *Attorney, Agent, or Firm* — Treyz Law Group, P.C.; Zachary D. Hadd

(57) ABSTRACT

An imager may include an imaging die that is stacked with an image processing die. The imaging die may generate output signals from received light. The image processing die may process the output signals. Through-silicon vias of the imaging die or solder balls may electrically couple the imaging die to the image processing die and convey the output signals to the image processing die. The imaging die may include a pixel array that generates pixel signals from the received light. The image processing die may generate control signals that control the imaging die and are conveyed to the imaging die over the through-silicon vias or solder balls.

18 Claims, 10 Drawing Sheets

(56) References Cited

U.S. PATENT DOCUMENTS

| | | | |
|---|---|---|---|
| 2008/0088014 A1* | 4/2008 | Adkisson et al. | 257/737 |
| 2008/0309810 A1* | 12/2008 | Smith et al. | 348/319 |
| 2010/0137143 A1* | 6/2010 | Rothberg et al. | 506/2 |
| 2010/0140732 A1* | 6/2010 | Eminoglu et al. | 257/447 |
| 2010/0208517 A1* | 8/2010 | Lo et al. | 365/175 |
| 2010/0245647 A1* | 9/2010 | Honda et al. | 348/308 |
| 2010/0259662 A1* | 10/2010 | Oike et al. | 348/308 |
| 2010/0276572 A1* | 11/2010 | Iwabuchi et al. | 250/208.1 |
| 2010/0301398 A1* | 12/2010 | Rothberg et al. | 257/253 |
| 2011/0215222 A1* | 9/2011 | Eminoglu et al. | 250/208.1 |
| 2012/0086095 A1* | 4/2012 | Nishiyama et al. | 257/432 |
| 2012/0187304 A1 | 7/2012 | Ha et al. | |
| 2012/0194719 A1 | 8/2012 | Churchwell et al. | |
| 2012/0241976 A1* | 9/2012 | Haba et al. | 257/774 |
| 2012/0242814 A1* | 9/2012 | Kubala et al. | 348/76 |
| 2012/0270360 A1* | 10/2012 | Mazzillo | 438/73 |
| 2012/0293698 A1* | 11/2012 | Sukegawa et al. | 348/294 |
| 2013/0162343 A1* | 6/2013 | Byeon | 327/564 |
| 2013/0228936 A1 | 9/2013 | Han et al. | |
| 2013/0256908 A1* | 10/2013 | Mclaurin | 257/774 |
| 2013/0320194 A1* | 12/2013 | Chen et al. | 250/208.1 |
| 2014/0042298 A1* | 2/2014 | Wan et al. | 250/208.1 |
| 2014/0042299 A1* | 2/2014 | Wan et al. | 250/208.1 |
| 2014/0077063 A1* | 3/2014 | Cho | 250/208.1 |
| 2014/0175592 A1* | 6/2014 | Iwabuchi et al. | 257/443 |

* cited by examiner

IMAGERS WITH STACKED INTEGRATED CIRCUIT DIES

This application claims the benefit of provisional patent application No. 61/703,617, filed Sep. 20, 2012 which is hereby incorporated by reference herein in its entirety.

BACKGROUND

This relates generally to imaging systems, and more particularly to imager packages.

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Imagers are typically implemented on an integrated circuit die. With ever-increasing imager complexity to satisfy consumer demands, the integrated circuit dies have correspondingly increased in die size. It can be challenging for conventional imagers implemented on integrated circuit dies to satisfy imaging performance requirements while maintaining compact dimensions for use in modern electronic devices.

DETAILED DESCRIPTION

Figure 1:
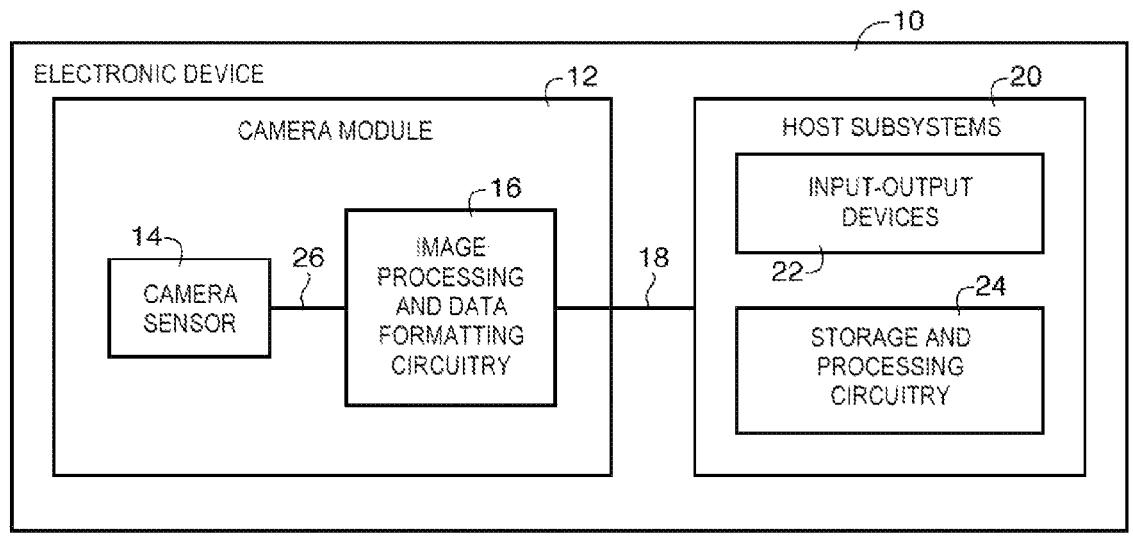
FIG. 1 is an illustrative schematic diagram of an electronic device with a camera sensor that may include stacked integrated circuit dies in accordance with an embodiment of the present invention.

Embodiments of the present invention relate to image sensors implemented using vertically stacked integrated circuit dies. An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from camera sensor 14 may be provided to image processing and data formatting circuitry 16 via path 26. Image processing and data formatting circuitry 16 may be used to perform image processing functions such as three-dimensional depth sensing, data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format).

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
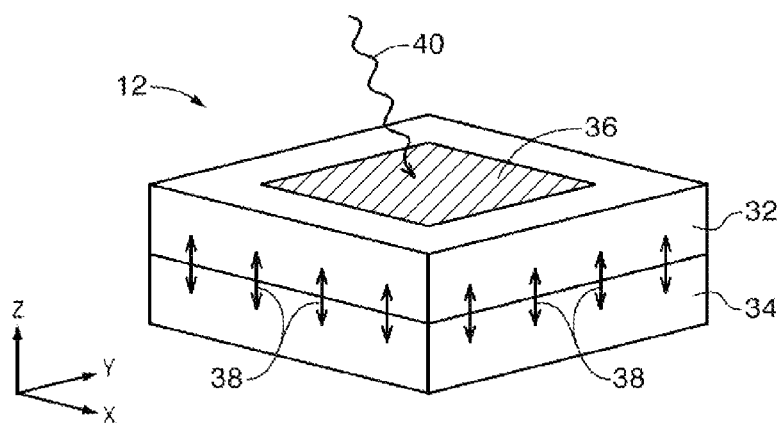
FIG. 2 is an illustrative imager having stacked integrated circuit dies in accordance with an embodiment of the present invention.

Camera sensor 14 and image processing and data formatting circuitry 16 may be implemented on an integrated circuit package having stacked integrated circuit dies as shown in FIG. 2. Camera module package 12 of FIG. 2 includes stacked integrated circuit dies 32 and 34. Integrated circuit die 32 may be vertically stacked on integrated circuit die 34 (e.g., a rear surface of die 32 may be stacked on a front surface of die 34). In other words, dies 32 and 34 may be stacked along the Z axis.

Integrated circuit die 32 may be used in implementing a camera sensor such as sensor 14 of FIG. 1 and may sometimes be referred to herein as an imaging die. For example, die 32 may include pixel array 36 that receives and converts light 40 into electrical signals. Integrated circuit die 34 may be used in implementing image processing and data formatting circuitry such as circuitry 16 of FIG. 1 and may sometimes be referred to herein as a processing die or an image processing die. Image processing die 34 may include readout circuitry that controls pixel array 36 of die 32 and receives image output signals during pixel readout operations. Integrated circuit dies 32 and 34 may be coupled via interconnect paths 38. Paths 38 may include through-silicon vias, solder balls, or other die-to-die connections and may collectively serve as paths 26 of FIG. 1 (as an example). Image signals may be conveyed from die 32 to die 34 over paths 38 for processing. Implementation of image processing circuitry on die 34 that is stacked with die 32 on which pixel array 36 is formed may help to reduce circuit area (e.g., X-Y area) of package 12.

Figure 3:
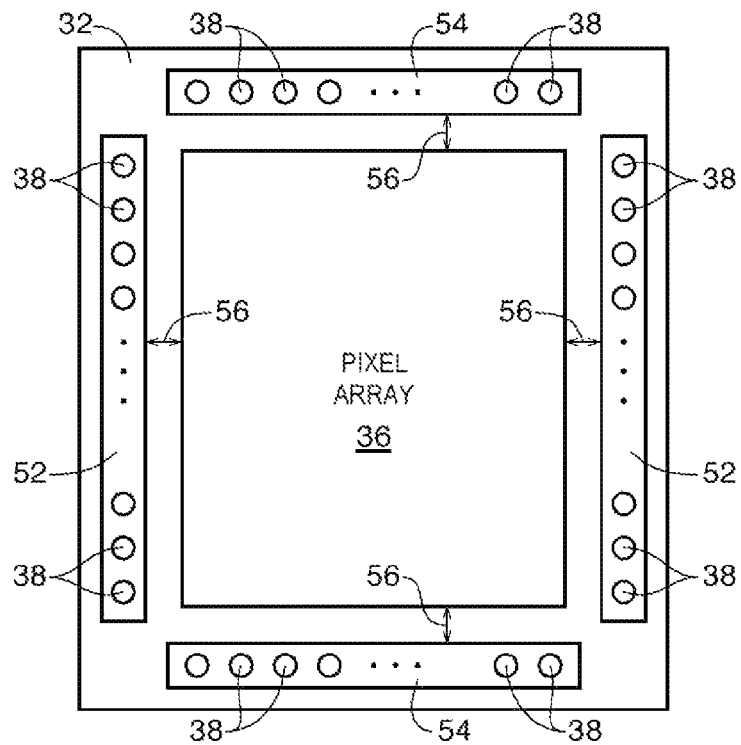
FIG. 3 is an illustrative diagram of an imaging die in accordance with an embodiment of the present invention.

FIG. 3 is an illustrative diagram of an imaging die 32 that includes pixel array 36. As shown in FIG. 3, imaging die 32 may include pixel array 36 and processing circuitry 52 and 54. Processing circuitry 52 and 54 may be electrically coupled to pixel array 36 via paths 56. Circuitry 52 and 54 may convey control signals to pixel array 36 over paths 56. Similarly, image signals from pixel array 36 may be conveyed to circuitry 52 and 54 via paths 56. Processing circuitry 52 and 54 may be coupled to off-chip circuitry (e.g., die 34 of FIG. 2) via paths 38.

Processing circuitry 52 and 54 may pass signals between off-chip circuitry and pixel array 36. For example, processing circuitry 54 may process and pass pixel image signals to die 34 via paths 38. Processing circuitry 54 may have substantially reduced image signal processing capabilities than off-chip circuitry. For example, processing circuitry 54 may include amplifier circuitry such as comparators. The amplifier circuitry may form a portion of analog-to-digital converter (ADC) circuitry that is partially implemented off-chip and is used in converting analog image signals to digital data (e.g., comparator output signals may be provided to off-chip ADC circuitry). This example is merely illustrative. Processing circuitry 54 may include circuitry having any desired processing capabilities. Image processing die 34 may provide additional processing capabilities that augment the capabilities of processing circuitry on imaging die 32. If desired, portions or all of processing circuitry 52 and 54 of imaging die 32 may be omitted from imaging die 32 and added to processing die 34.

Processing circuitry 52 may provide control signals to pixel array 36 based on off-chip control signals received via paths 38. For example, processing circuitry 52 may receive address signals and pixel reference voltages from off-chip circuitry. Processing circuitry 52 may include decoder circuitry that decodes the address signals into control signals for transistors of pixel array 36 (e.g., control signals provided to gates of transistors such as pass gate transistors, row select transistors, etc.). Processing circuitry 52 may include driver circuitry that drives circuitry of pixel array 36 with the control signals and provides the pixel reference voltages to pixel array 36.

Figure 4:
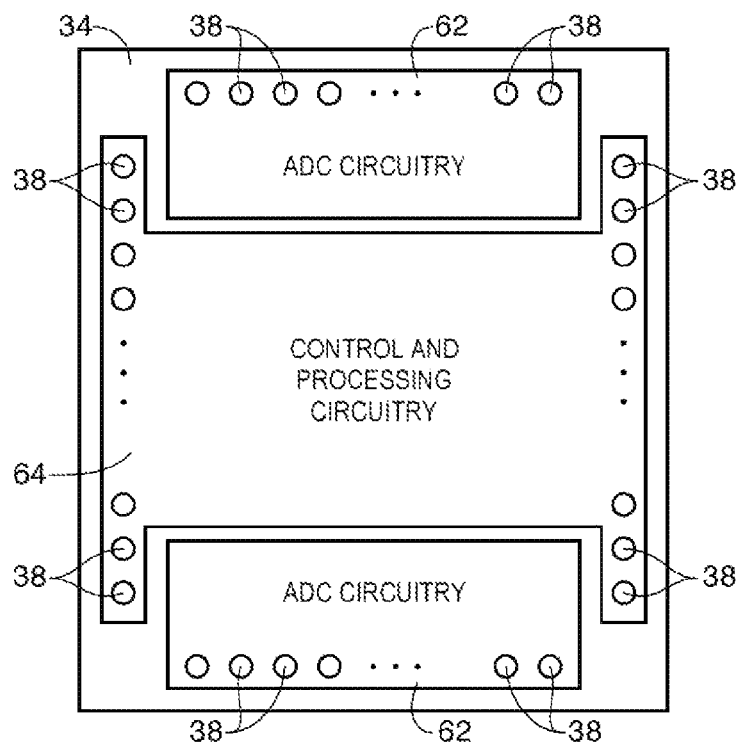
FIG. 4 is an illustrative diagram of an image processing die that may be stacked with an imaging die in accordance with an embodiment of the present invention.

FIG. 4 is a diagram of an illustrative image processing die 34 that may be stacked with an imaging die such as imaging die 32 of FIG. 3 (e.g., stacked as shown in FIG. 2). As shown in FIG. 4, image processing die 34 may include ADC circuitry 62 and control and processing circuitry 64. ADC circuitry 62 may include circuitry such as a counter and ramp circuitry that generates a ramp signal for applying to an input of amplifier circuitry within processing circuitry 52 of FIG. 3. Control and processing circuitry 64 may generate control signals such as address signals, timing control signals, pixel reference voltages, and other control signals for imaging die 32. The control signals may be conveyed to imaging die 32 via paths 38.

Figure 5:
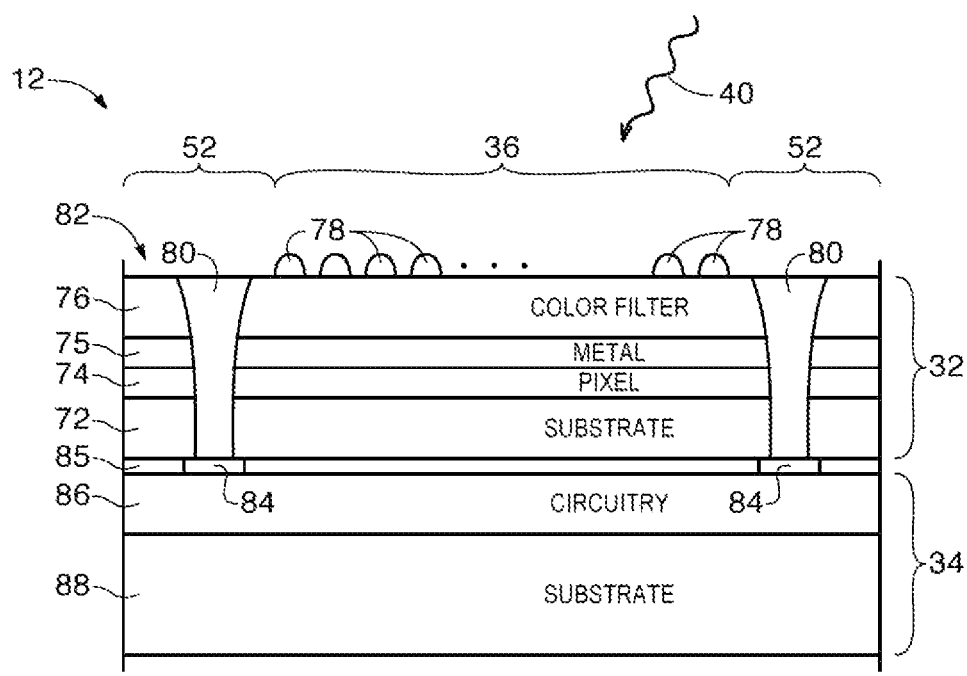
FIG. 5 is an illustrative cross-sectional side view of an imager with a front-side illuminated imaging die coupled to an image processing die using through-silicon vias in accordance with an embodiment of the present invention.

FIG. 5 is an illustrative cross-sectional side view of a stacked imager package such as package 12 of FIG. 2. As shown in FIG. 5, stacked imager package 12 includes imaging die 32 and image processing die 34. Imaging die 32 may include a substrate layer 72 such as a semiconductor substrate (e.g., silicon). A pixel array 36 may be formed using a region of substrate 72. Pixel structures of pixel array 36 may be formed in pixel layer 74 on substrate 72. For example, pixel structures such as photodiodes and transistors may be formed by doping portions of substrate 72 (e.g., by depositing dopants such as n-type and p-type dopants at the surface of substrate 72). Pixel layer 74 may be covered by one or more metal layers 75 that are patterned to form conductive interconnects that electrically couple pixel structures to form desired circuit structures.

Color filter structures may be formed in color filter layer 76 that covers pixel layer 74. The color filter structures may include a color filter for each underlying pixel in pixel layer 74 that passes only desired wavelengths of light (e.g., wavelengths corresponding to a desired color such as blue, green, or red of the underlying pixel). The color filters may be formed in a Bayer pattern or any desired pattern. If desired, one or more pixels in the pattern may pass wavelengths of multiple colors of light. As an example, one or more pixels may be clear pixels that are substantially transparent. Each pixel of pixel array 36 may be covered by a respective microlens 78 that focuses incident light 40 on the pixel structures of that pixel (e.g., through color filter layer 76 to the light-sensitive regions of that pixel within pixel layer 74).

Regions of imaging die 32 that are not used in forming pixel structures may be used in implementing processing circuitry such as circuitry 52 and 54 of FIG. 3. In the example of FIG. 5, regions 52 of imaging die 32 may be used in forming processing circuitry and through-silicon vias (TSVs) 80. Processing circuitry may be formed in layers 74 and 75 of regions 52 similarly to pixel circuitry formed in pixel array region 36 (e.g., transistor structures in layer 74 and interconnect paths in layer 75).

Through-silicon vias 80 may extend between front surface 82 of die 32 and contacts on the rear surface of die 32. In other words, through-silicon vias 80 may pass through substrate 72 and layers 74 and 76. A through-silicon via 80 may, for example, be formed by etching, drilling, or otherwise forming a gap through layers 72, 74, and 76. The gap may be substantially cylindrical. Subsequently, a conductive material such as metal may be deposited within the gap (e.g., filling the gap). Through-silicon vias 80 may electrically couple circuitry within layer 74 and/or layer 75 to contacts 84 at the rear surface of die 32.

Image processing die 34 may include substrate 88 and circuitry 86 formed on substrate 88. For example, ADC circuitry 62 and control and processing circuitry 64 may be formed in circuitry layer 86 on substrate 88. The rear surface of imaging die 32 may be coupled to the front surface of image processing die 34 by layer 85. Layer 85 may include adhesive materials for attaching dies 32 and 34. Contacts 84 may extend through layer 85 and electrically couple dies 32 and 34. Through-silicon vias 80 and contacts 84 may serve as paths 38 that convey control and image signals between circuitry of layers 74 and 75 of die 32 and layer 86 of die 34.

Imaging dies such as die 32 of FIG. 5 in which incident light is received by pixel structures 74 through patterned metal layers such as layer 75 may sometimes be referred to as front side illumination (FSI) imaging dies (e.g., because incident light is received at the front side of substrate 72 on which pixel circuitry is formed). If desired, back-side illumination (BSI) imaging dies may be used in stacked die arrangements as shown in FIG. 6.

Figure 6:
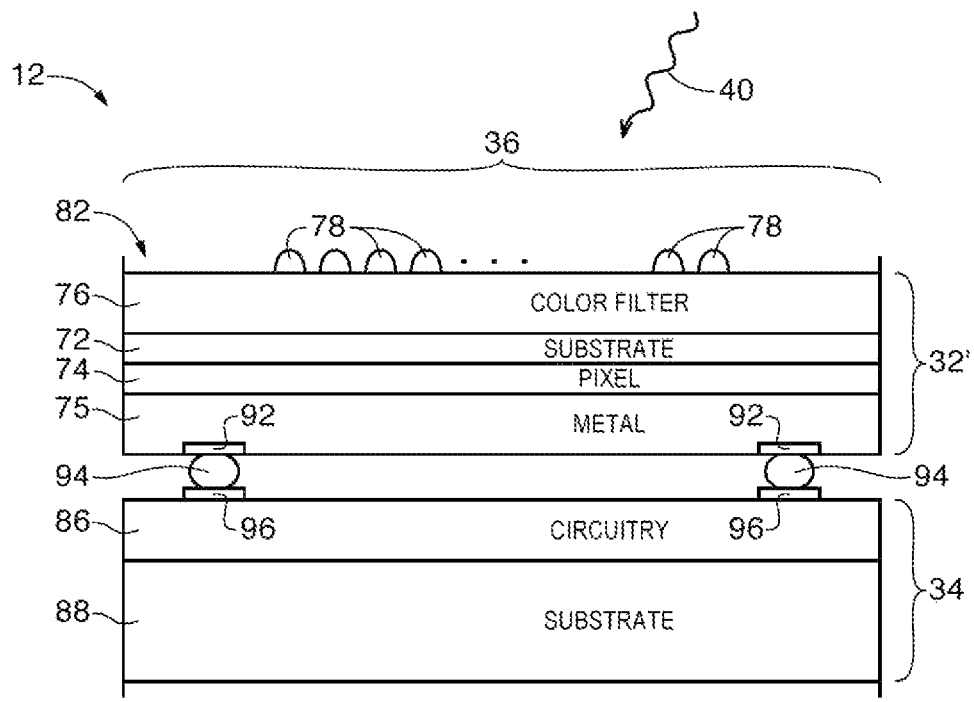
FIG. 6 is an illustrative cross-sectional side view of an imager with a back-side illuminated imaging die coupled to an image processing die using solder balls in accordance with an embodiment of the present invention.

In the example of FIG. 6, stacked die package 12 includes a back-side illumination imaging die 32' in which incident light 40 is received through substrate 72. In other words, substrate-pixel-metal layers may be reversed in orientation with respect to the front-side illumination arrangement of FIG. 5. For back-side illuminated die 32', circuitry such as processing circuitry 52 and 54 of FIG. 3 can be formed within the region of pixel array 36, because circuitry formed in metal layer 75 is underneath pixel layer 74 and does not prevent incident light 40 from reaching light-sensitive regions of layer 74.

As shown in FIG. 6, through-silicon vias 80 can be omitted for back-side illuminated imaging die 32', because processing circuitry of metal layer 75 is located at a rear surface of imaging die 32' (e.g., it is not necessary to traverse pixel or substrate layers, because metal layer 75 is exposed). Metal contacts 92 formed at the surface of metal layer 75 may be coupled to corresponding contacts 96 of image processing die 34 via connections 94 (e.g., solder balls). Metal contacts 92, 96, and connections 94 may form signal paths such as paths 38 of FIG. 2.

Figure 7:
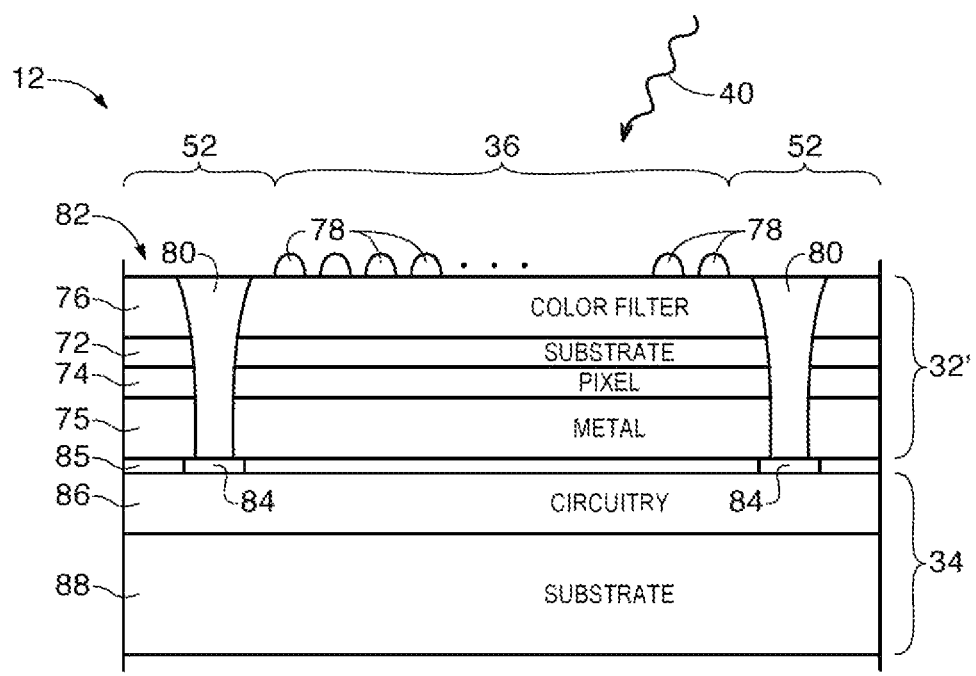
FIG. 7 is an illustrative cross-sectional side view of an imager with a back-side illuminated imaging die coupled to an image processing die using through-silicon vias in accordance with an embodiment of the present invention.

The example of FIG. 6 in which a backside illuminated (BSI) imager die is coupled to an image processing die via solder bumps is merely illustrative. If desired, a BSI imager die may be provided with through-silicon vias as shown in FIG. 7. In the example of FIG. 7, BSI die 32' may be provided with regions 52 adjacent to pixel array region 36 through which through-silicon vias may be formed that extend from surface 82 of die 32' to contacts 84. In general, dies of a stacked die package may be attached via any desired techniques such as using adhesive or solder.

Figure 8:
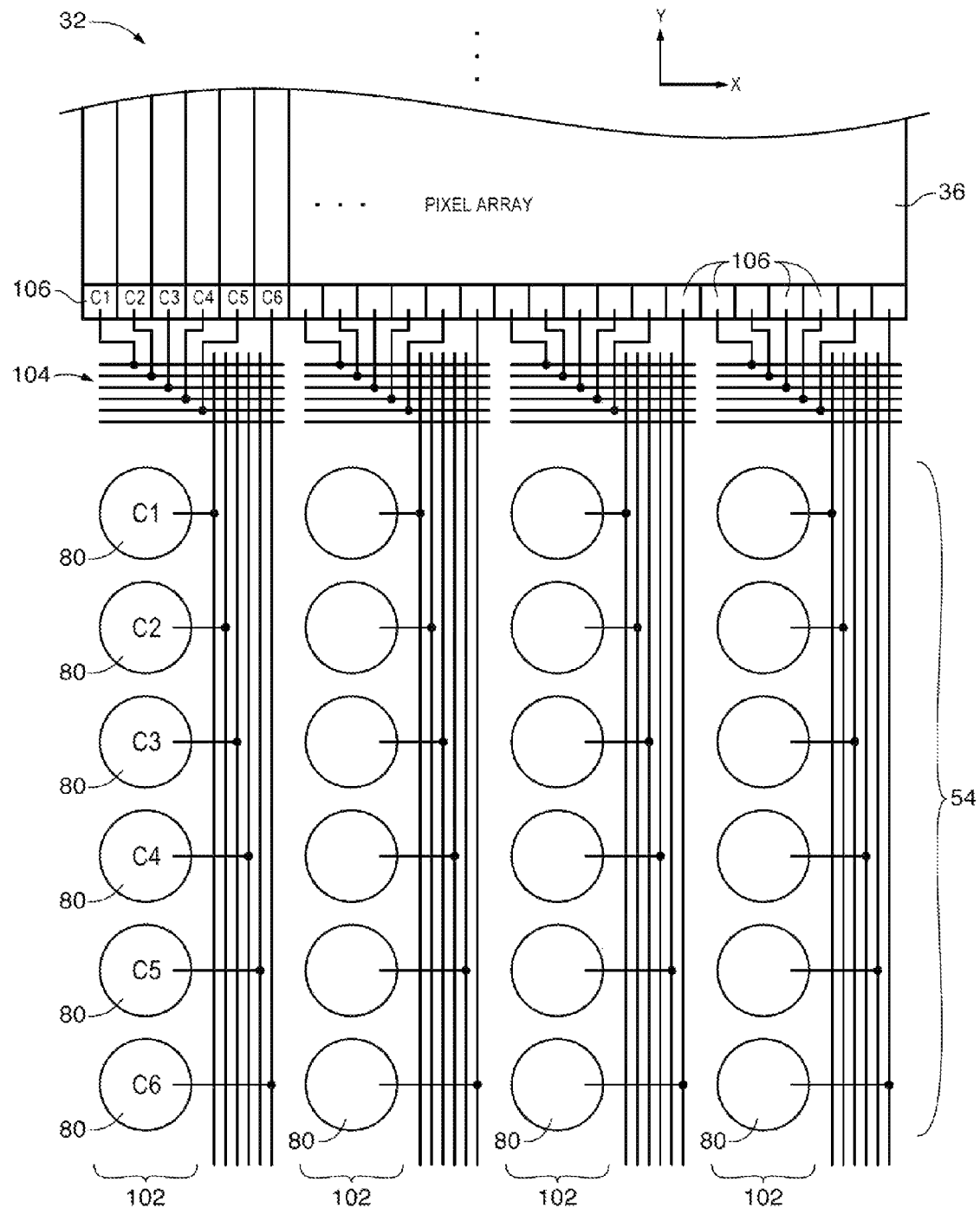
FIG. 8 is an illustrative diagram of a portion of an imaging die with through-silicon vias that are coupled to respective pixel array columns in accordance with an embodiment of the present invention.

Through-silicon vias such as through-silicon vias 80 of FIG. 5 may occupy a disproportionate amount of circuit area relative to circuitry such as interconnects and transistors on imaging die 32. For example, each pixel may have a diameter of about 1-3 um, whereas each through-silicon via may have a diameter of about 4-6 um. FIG. 8 is a layout view of an illustrative portion of an imaging die 32 showing how through-silicon vias 80 may be formed within a region 54 of imaging die 32. Through-silicon vias 80 may be formed similarly in other regions of imaging die 32 such as regions 52 of FIG. 3.

As shown in FIG. 8, each pixel column such as columns C1, C2, C3, C4, C5, and C6 may be coupled to a respective through-silicon via 80 via a respective path 104. Each pixel column may have an associated processing circuit 106 that generates signals based on image signals for that pixel column and provides the generated signals to a respective through-silicon via. Processing circuits 106 may each include sample-and-hold circuitry and amplifier circuitry such as a comparator (as examples).

Sets 102 of through-silicon vias may be associated with respective groups of pixel columns of pixel array 36. In the example of FIG. 8, each set 102 includes six through-silicon vias that are arranged along the Y-axis, because the width along the X axis of six pixel columns is comparable (e.g., equivalent) to the width of the diameter of through-silicon vias 80 combined with the width of interconnects 104 used to convey pixel signals from the pixel columns to the through-silicon vias. However, this example is merely illustrative. The number of through-silicon vias extending along the Y-axis for each set 102 may be determined based on the width of each pixel column, the through-silicon vias, and interconnects.

Figure 9:
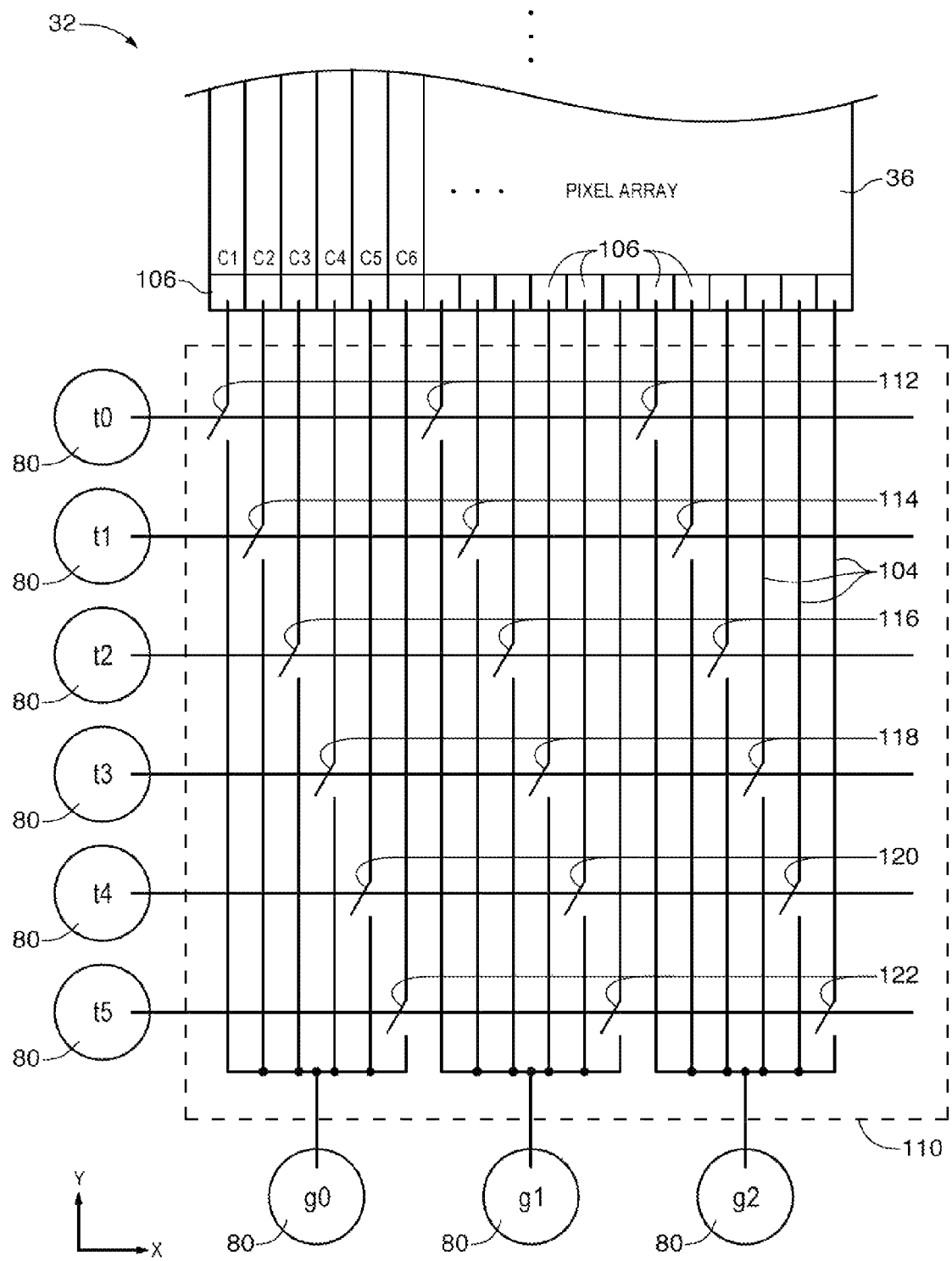
FIG. 9 is an illustrative diagram of a portion of an imaging die with through-silicon vias that are coupled to respective groups of pixel array columns using time multiplexing circuitry in accordance with an embodiment of the present invention.

If desired, time-multiplexing circuitry may be used to perform time multiplexing between pixel columns. FIG. 9 is a diagram of an illustrative portion of imaging die 32 in which columns of pixel array 36 are grouped and assigned to respective through-silicon vias 80. In the example of FIG. 9, six columns are assigned to each of through-silicon vias G0, G1, and G2 (e.g., columns C1-C6 are assigned to through-silicon via G0). Use of a single through-silicon via to handle signals from a group of columns can help to reduce X-Y area of imaging die 32, because fewer through-silicon vias are needed to handle the signals from pixel array 36. If desired, the size or pitch of the through-silicon vias may instead be increased.

Time-multiplexing circuitry 110 may receive pixel signals from each column via paths 104 and provide a selected pixel signal from each group of columns to a respective through-silicon via 80. Circuitry 110 may include switches 112, 114, 116, 118, 120, and 122 for each group of columns. Each switch may be controlled by a corresponding control signal received from off-chip circuitry at a through-silicon via 80. For example, an image processing die may provide control signals t0, t1, t2, t3, t4, and t5 for switches 112, 114, 116, 118, 120, and 122, respectively. Each control signal may selectively enable or disable the switches that are controlled by that control signal.

During time-multiplexing operations, each pixel column of a group may be assigned a different time slot. For example, columns coupled to switch 112 may be assigned a first time slot, columns coupled to switch 114 may be assigned a second time slot, columns coupled to switch 116 may be assigned a third time slot, etc. A pixel signal may be selected from each group of columns based on the control signals provided to the switches. For example, one image signal from columns C1-C6 may be selected by enabling a selected switch and disabling the remaining switches associated with columns C1-C6. The image signal from column C1 may be selected by asserting signal t0 (enabling switches 112) and de-asserting signals t1-t5 (disabling switches 114-122). In this scenario, for each group of columns, the pixel column coupled to switches 112 may be selected for use. Similarly, other pixel columns may be selected by selectively enabling and disabling switches 112-122.

The example of FIG. 9 in which time-multiplexing circuitry is implemented using a switch for each column is merely illustrative. If desired, time-multiplexing circuitry may use a multiplexer to select a signal from each group and provide the selected signals to respective through-silicon vias 80.

Figure 10:
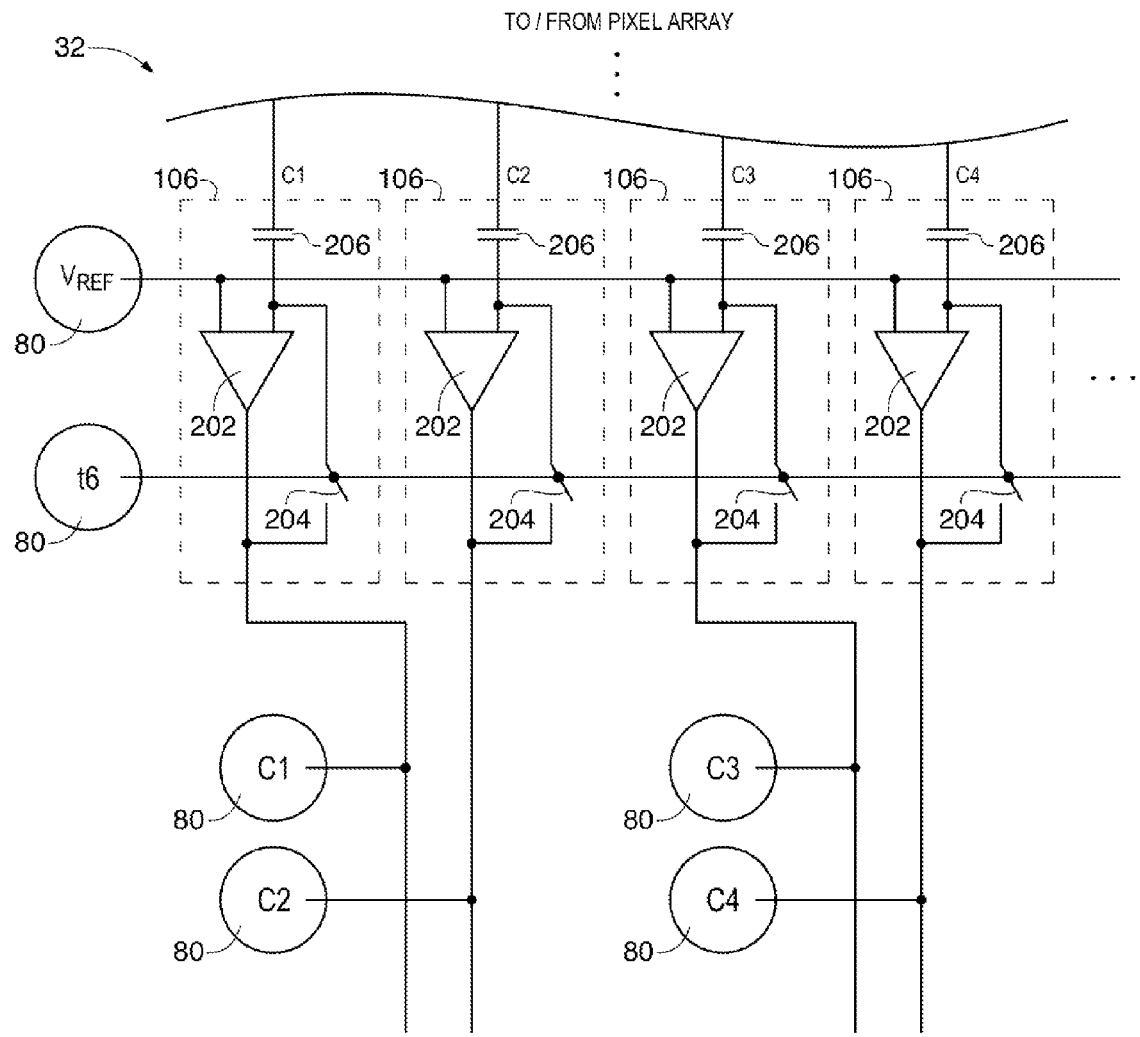
FIG. 10 is an illustrative diagram of a portion of an imaging die with processing circuits that process pixel signals and provide output signals to through-silicon vias in accordance with an embodiment of the present invention.

FIG. 10 is an illustrative diagram of a portion of imaging die 32 having processing circuits 106 with amplifier circuitry. As shown in FIG. 10, each column (e.g., C1 ... C4) is coupled to a respective processing circuit 106. Each processing circuit 106 may receive off-chip signals such as a reference voltage VREF and control signal t6 over through-silicon vias 80. Each processing circuit 106 may process image signals received from a corresponding column based on the received off-chip signals and provide the processed signal to a through-silicon via 80.

Each processing circuit 106 may include a comparator 202, a switch 204, and a capacitor 206. This example is merely illustrative. Each processing circuit 106 may include any desired processing circuitry such as sampling and hold circuitry, amplifier circuitry, portions of analog-to-digital converter circuitry, etc. Capacitors 206 may be used in sampling image signals received from pixel columns. Comparators 202 may compare reference voltage VREF to the sampled image signals. Switches 204 may be controlled by signal t6 to perform auto-zero operations in which reset image pixel values are sampled from the pixel columns by shorting the columns to the outputs of comparators 202.

Figure 11:
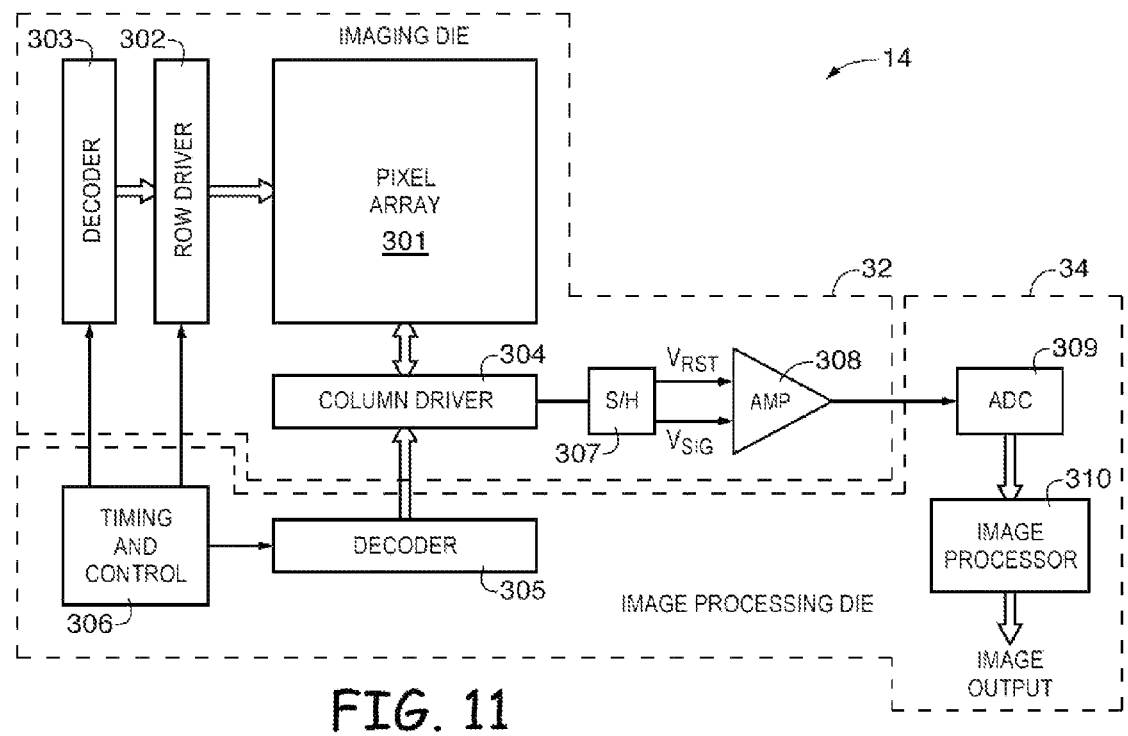
FIG. 11 is a block diagram of an imager having an imaging die stacked with an image processing die in accordance with an embodiment of the present invention.

FIG. 11 illustrates a simplified block diagram of a stacked imager 14, for example a CMOS imager, employing a pixel array 301. Pixel array 301 includes a plurality of pixels arranged in a predetermined number of columns and rows. The row lines are selectively activated by the row driver 302 in response to row address decoder 303 and the column select lines are selectively activated by the column driver 304 in response to column address decoder 305. Thus, a row and column address is provided for each pixel.

Imager 14 is operated by a timing and control circuit 306, which controls decoders 303 and 305 for selecting the appropriate row and column lines for pixel readout, and row and column driver circuitry 302, 304, which apply driving voltages to the drive transistors of the selected row and column lines. The pixel signals, which typically include a pixel reset signal Vrst and a pixel image signal Vsig for each pixel (or each photosensitive region of each pixel) are sampled by sample and hold circuitry 307 associated with the column driver 304 (e.g., capacitors such as capacitor C1 of FIG. 10 and switches such as switches 204 that are controlled during sample and hold operations). A differential signal Vrst−Vsig is produced for each pixel (or each photosensitive area of each pixel), which is amplified by an amplifier 308 (e.g., a comparator) and digitized by analog-to-digital converter circuitry 309. The analog to digital converter circuitry 309 and amplifier 308 converts the analog pixel signals to digital signals, which are fed to an image processor 310 which forms a digital image. Image processor 310 may, for example, be provided as part of image processing and data formatting circuitry 16 of FIG. 1.

As shown in FIG. 11, image processing and control circuitry such as timing and control circuitry 306, column decoder 305, analog-to-digital circuitry 309, and image processor 310 may be implemented using an image processing die 34, whereas imaging die 32 may include row decoder circuitry 303, row driver circuitry 302, pixel array 301, column driver 304, sample-and-hold circuitry 307, and amplifier 308. Image processing die 34 may be stacked with imaging die 32 and may communicate over connections such as through-silicon vias or solder bumps. The example of FIG. 11 is merely illustrative. If desired, any desired processing or control circuitry may be implemented on imaging die 32 or image processing die 34. For example, row decoder circuitry 303 may be implemented on image processing die 34. As another example, sample-and-hold circuitry 307 and amplifier 308 may be implemented on image processing die 34. As yet another example, analog-to-digital converter circuitry 309 and column decoder circuitry 305 may be implemented on imaging die 32. If desired, portions of circuitry may be implemented on different dies. For example, a first portion of sample-and-hold circuitry such as capacitors and switches may be implemented using imaging die 32 whereas a second portion of sample-and-hold circuitry (e.g., additional capacitors and switches) may be implemented using image processing die 34.

Figure 12:
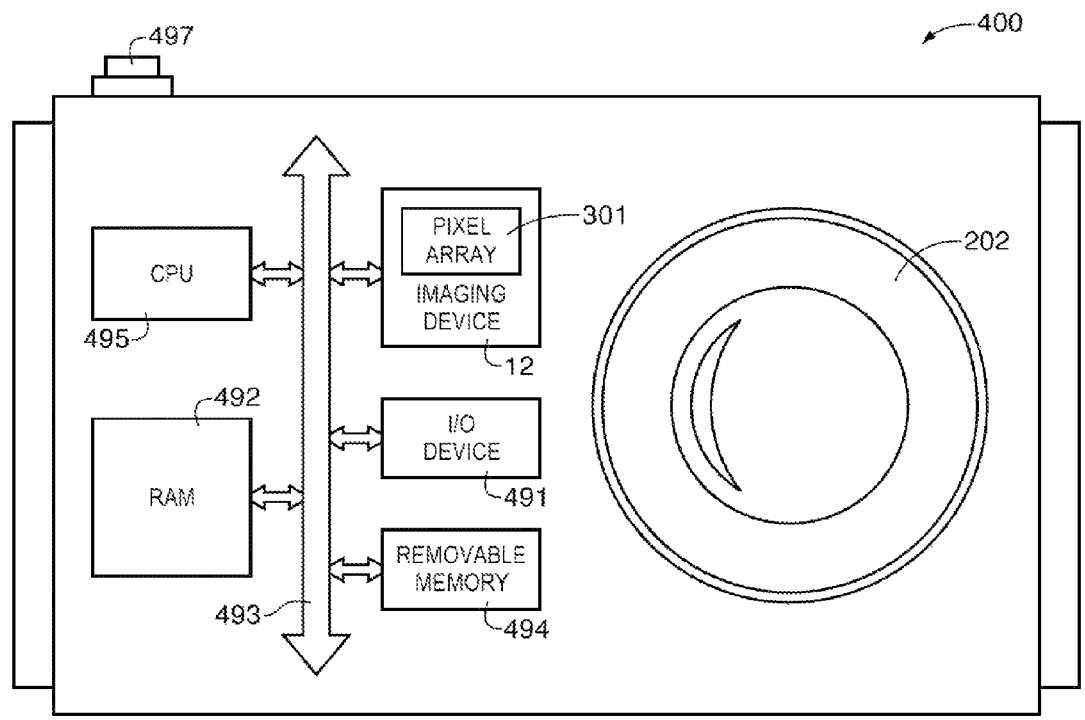
FIG. 12 is a block diagram of a processor system employing the imager of FIG. 11 in accordance with an embodiment of the present invention.

FIG. 12 is a simplified diagram of an illustrative processor system 400, such as a digital camera, which includes an imaging device 12 (e.g., the camera module of FIG. 1) employing an imager having stacked dies as described above. The processor system 400 is exemplary of a system having digital circuits that could include imaging device 12. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 400, for example a digital still or video camera system, generally includes a lens 202 for focusing an image on pixel array 301 when a shutter release button 497 is pressed, central processing unit (CPU) 495, such as a microprocessor which controls camera and one or more image flow functions, which communicates with one or more input/output (I/O) devices 491 over a bus 493. Imaging device 12 also communicates with CPU 495 over bus 493. System 400 also includes random access memory (RAM) 492 and can optionally include removable memory 494, such as flash memory, which also communicates with CPU 495 over the bus 493. Imaging device 12 may be combined with the CPU, with or without memory storage on a single integrated circuit or on a different chip. Although bus 493 is illustrated as a single bus, it may be one or more busses, bridges or other communication paths used to interconnect system components of system 400.

Figure 13:
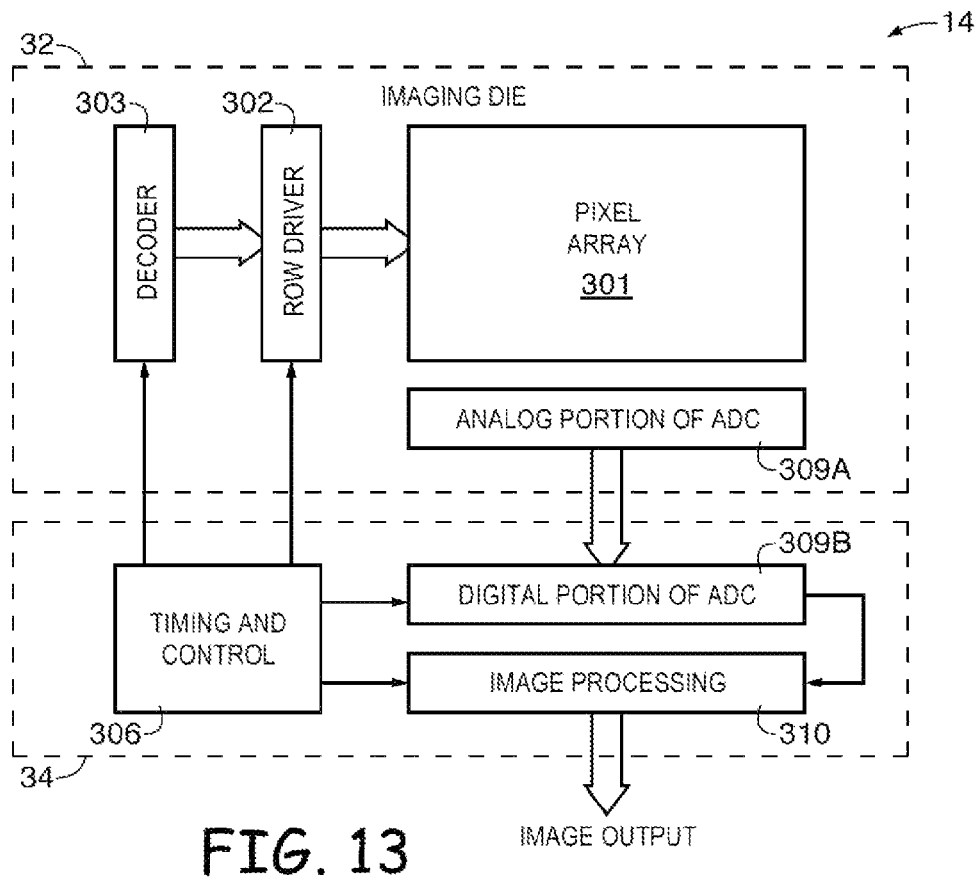
FIG. 13 is a block diagram of an imager having an imaging die with an analog ADC portion stacked with an image processing die having a digital ADC portion in accordance with an embodiment of the present invention.

FIG. 13 is a block diagram of an imager 14 having an imaging die 32 with an analog ADC portion 309A stacked with an image processing die 34 having a digital ADC portion 309B. Analog ADC portion 309A may handle and process analog pixel output signals, whereas digital ADC portion 309B may process output signals from analog ADC portion 309A to produce digital output signals representative of the analog pixel output signals.

Figure 14:
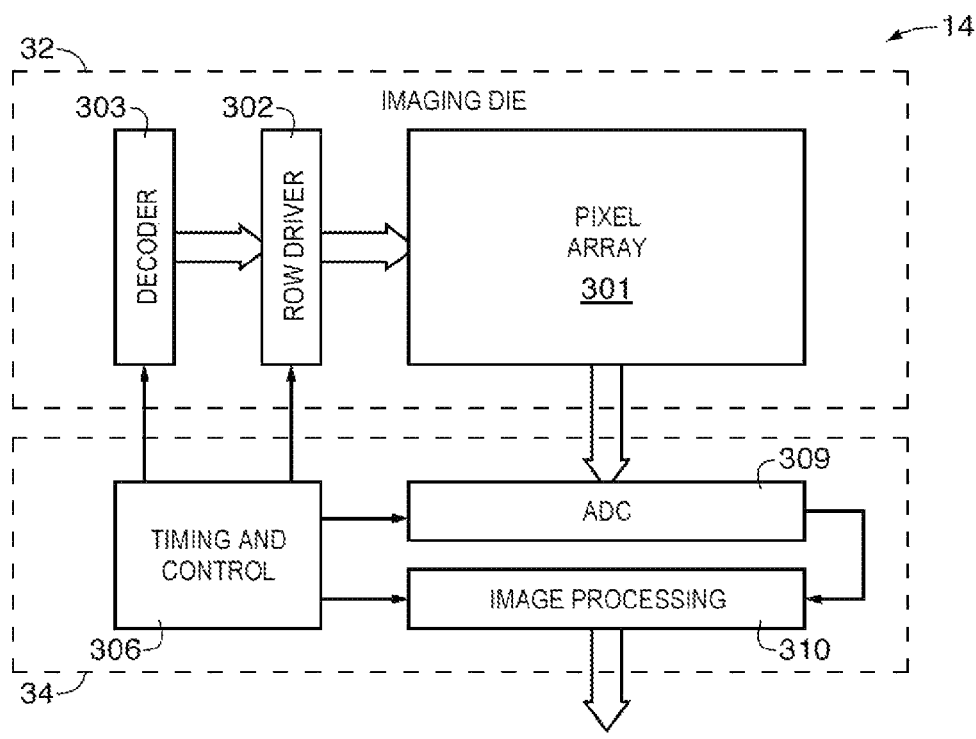
FIG. 14 is a block diagram of an imager having an imaging die stacked with an image processing die having ADC circuitry in accordance with an embodiment of the present invention.

FIG. 14 is a block diagram of an imager 14 having an imaging die 32 stacked with an image processing die 34 having ADC circuitry 309. In the example of FIG. 14, ADC circuitry 309 is formed entirely on image processing die 34.

Figure 15:
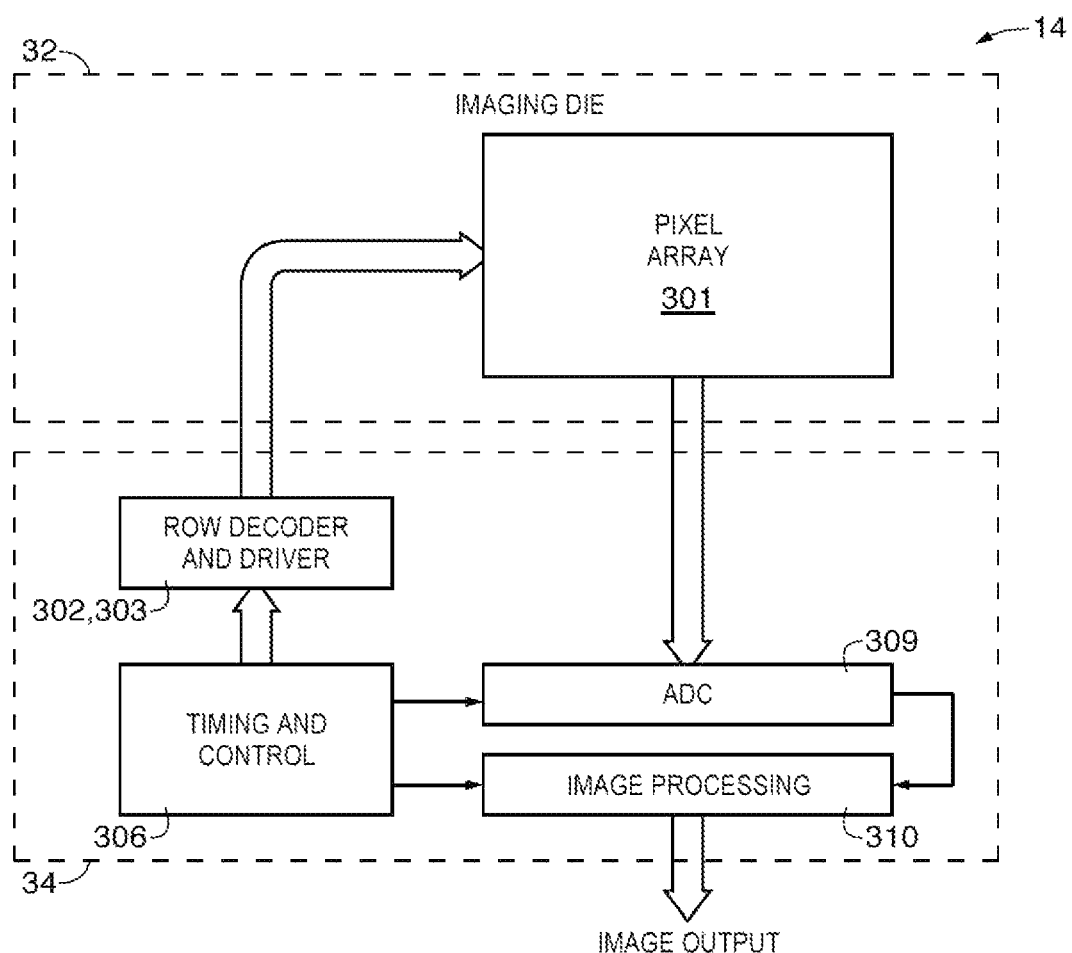
FIG. 15 is a block diagram of an imager having an imaging die stacked with an image processing die having ADC circuitry and row decoder and driver circuitry in accordance with an embodiment of the present invention.

If desired, row driver circuitry 302 and decoder circuitry 303 may be formed on image processing die 34 as shown in FIG. 15. In this scenario, row control signals may be provided to pixel array 301 over die-to-die connections such as solder bumps, through-silicon vias, etc.

Various embodiments have been described illustrating imagers with stacked integrated circuit dies.

An imager may include first and second integrated circuit dies that are stacked. The first integrated circuit die may be an imaging die such as a front-side illuminated or back-side illuminated imaging die that receives light. The second integrated circuit die may be an image processing die that receives and processes output image signals from the imaging die. The imaging die may be mounted on the image processing die. Through-silicon vias of the imaging die or solder balls may electrically couple the imaging die to the image processing die and convey output image signals to the image processing die.

The imaging die may include a pixel array that receives light and generates pixel signals from the received light. The image processing die may generate control signals that control the imaging die and are conveyed to the imaging die over the through-silicon vias. The pixel array may be arranged in rows and columns. Each column may be coupled to a respective through-silicon via or groups of columns may be coupled to respective through-silicon vias. Time multiplexing circuitry coupled between a group of columns and a through-silicon via may be shared between the columns of the group.

The foregoing is merely illustrative of the principles of this invention and various modifications can be made by those skilled in the art without departing from the scope and spirit of the invention.

What is claimed is:

1. An imager, comprising:
   an imaging die that receives light, wherein the imaging die comprises a pixel array that is arranged in rows and columns;
   an image processing die that is stacked with the imaging die and processes output image signals from the imaging die; and
   a plurality of through-silicon vias in the imaging die that electrically couple the imaging die to the image processing die, wherein each of the plurality of through-silicon vias is coupled to a corresponding one of the columns in the pixel array.

2. The imager defined in claim 1, wherein the through-silicon vias in the imaging die convey the output image signals to the image processing die.

3. The imager defined in claim 2 wherein the imaging die comprises processing circuitry, wherein the pixel array receives light and generates pixel signals from the received light, and wherein the processing circuitry comprises:
   sample and hold circuitry; and
   amplifier circuitry.

4. The imager defined in claim 3 further comprising:
   an additional plurality of through-silicon vias, wherein the image processing die generates control signals that control the imaging die and wherein the additional plurality of through-silicon vias convey the control signals to the imaging die.

5. The imager defined in claim 4 wherein the imaging die comprises a front-side illuminated imaging die.

6. The imager defined in claim 4 wherein the imaging die comprises a back-side illuminated imaging die.

7. The imager defined in claim 1 further comprising:
   time multiplexing circuitry coupled between each of the plurality of through-silicon vias and each corresponding column.

8. The imager defined in claim 4 wherein the processing circuitry produces the output imaging signals and conveys the output imaging signals to the image processing die over the through-silicon vias.

9. The imager defined in claim 3 wherein the imaging die is mounted to the image processing die via solder balls and wherein the image output signals are conveyed from the imaging die to the image processing die via the solder balls.

10. An integrated circuit package, comprising:
    a first integrated circuit die that includes a pixel array that generates pixel signals, wherein the first integrated circuit die comprises time multiplexing circuitry;
    a second integrated circuit die stacked with the first integrated circuit die, wherein the second integrated circuit die generates a first set of control signals that control the pixel array of the first integrated circuit die, and wherein the second integrated circuit die generates a second set of control signals that control the time multiplexing circuitry.

11. The integrated circuit package defined in claim 10 wherein the first integrated circuit die comprises:
    a substrate layer;
    a pixel layer in which the pixel array is formed; and
    at least one patterned metal layer.

12. The integrated circuit defined in claim 11 wherein the substrate layer of the first integrated circuit die is mounted to the second integrated circuit die, wherein the pixel layer covers the substrate layer, and wherein the at least one patterned metal layer covers the pixel layer.

13. The integrated circuit package defined in claim 12 wherein the first integrated circuit die further comprises:
    a through-silicon via that extends through the substrate layer, the pixel layer, and the at least one patterned metal layer, wherein the through-silicon via conveys at least one of the first and second sets of control signals from the second integrated circuit die to the pixel array of the first integrated circuit die.

14. The integrated circuit package defined in claim 11 wherein the pixel array receives light through the substrate layer and generates the pixel signals from the received light, wherein the first integrated circuit die provides the generated pixel signals to the second integrated circuit die.

15. A system, comprising:
    a central processing unit;
    memory;
    input-output circuitry; and
    an imaging device, wherein the imaging device comprises:
        a first integrated circuit die comprising:
            a pixel array that generates image signals in response to light;
            time-multiplexing circuitry that is coupled to the pixel array; and
            a plurality of processing circuits interposed between the pixel array and the time-multiplexing circuitry, wherein the plurality of processing circuits receive the image signals and generate processed signals based on the image signals, and wherein the plurality of processing circuits provide the processed signals to the time-multiplexing circuitry;
        a second integrated circuit die on which the first integrated circuit die is mounted; and
        a lens that focuses an image on the pixel array of the first integrated circuit die.

16. The system defined in claim 15 wherein the first integrated circuit die comprises:
    a substrate; and
    through-silicon vias that extend through the substrate.

17. The system defined in claim 16 wherein the first integrated circuit die comprises:
    comparator circuitry that receives pixel signals from the pixel array and generates output signals, wherein the through-silicon vias convey the output signals from the comparator circuitry to the second integrated circuit die.

18. The system defined in claim 16 wherein the second integrated circuit die comprises:
    analog-to-digital converter circuitry that receives the output signals from the first integrated circuit die and produces digital output signals;
    image processor circuitry that receives and processes the digital output signals; and
    control circuitry that produces control signals for the pixel array, wherein the control signals are conveyed from the second integrated circuit die to the pixel array of the first integrated circuit die over the through-silicon vias.

* * * * *